(12) United States Patent
Gerber

(10) Patent No.: US 7,804,698 B2
(45) Date of Patent: Sep. 28, 2010

(54) SWITCHED CAPACITOR CONTROLLER AND METHOD THEREFOR

(75) Inventor: Remi Gerber, Pins-Justaret (FR)

(73) Assignee: Semiconductor Components Industries, LLC, Phoenix, AZ (US)

(*) Notice: Subject to any disclaimer, the term of this patent is extended or adjusted under 35 U.S.C. 154(b) by 625 days.

(21) Appl. No.: 11/573,592

(22) PCT Filed: Jul. 11, 2005

(86) PCT No.: PCT/US2005/024445
§ 371 (c)(1),
(2), (4) Date: Feb. 12, 2007

(87) PCT Pub. No.: WO2007/008202
PCT Pub. Date: Jan. 18, 2007

(65) Prior Publication Data
US 2008/0094041 A1 Apr. 24, 2008

(51) Int. Cl.
*H02M 3/18* (2006.01)
*H02M 7/155* (2006.01)

(52) U.S. Cl. .................................. 363/60; 307/110
(58) Field of Classification Search .................. 323/282, 323/233, 217, 223, 224, 225; 363/60, 59; 307/101, 110; 327/536
See application file for complete search history.

(56) References Cited

U.S. PATENT DOCUMENTS

| 5,341,278 A * | 8/1994 | Brooks | 363/16 |
| 6,340,939 B1 * | 1/2002 | Dedic | 341/136 |
| 6,504,351 B2 * | 1/2003 | Eagar et al. | 323/282 |
| 2003/0173940 A1 * | 9/2003 | Kovarik et al. | 323/282 |

* cited by examiner

*Primary Examiner*—Gary L Laxton
*Assistant Examiner*—Nusrat J Quddus
(74) *Attorney, Agent, or Firm*—Robert F. Hightower

(57) ABSTRACT

In one embodiment, a switch capacitor controller (20) is configured to use a drive signal (45) to drive the switched capacitor (26) with a signal having a time dependent transition time.

17 Claims, 5 Drawing Sheets

US 7,804,698 B2

SWITCHED CAPACITOR CONTROLLER AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to form dc-to-dc (dc/dc) voltage regulators. One particular form of a dc/dc voltage regulator utilized a flying capacitor that was alternately charged by the dc voltage and then coupled in series with the dc voltage to form an output voltage. These types of dc/dc voltage regulators were sometimes referred to as charge pump dc/dc converters. One common problem with these dc/dc converters was noise that resulted from switching the flying capacitor. This noise using resulted from current spikes that occurred when the flying capacitor was switched in series with the dc voltage source.

Accordingly, it is desirable to have a dc/dc voltage regulator that has reduced noise generation and that minimizes current spikes when the flying capacitor is switched.

For simplicity and clarity of illustration, elements in the figures are not necessarily to scale, and the same reference numbers in different figures denote the same elements. Additionally, descriptions and details of well-known steps and elements are omitted for simplicity of the description As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein generally are not exact terms that mean an action takes place instantly upon an initiating action but that there may be some small but reasonable delay between the reaction that is initiated by the initial action.

DETAILED DESCRIPTION OF THE DRAWINGS

Figure 1:
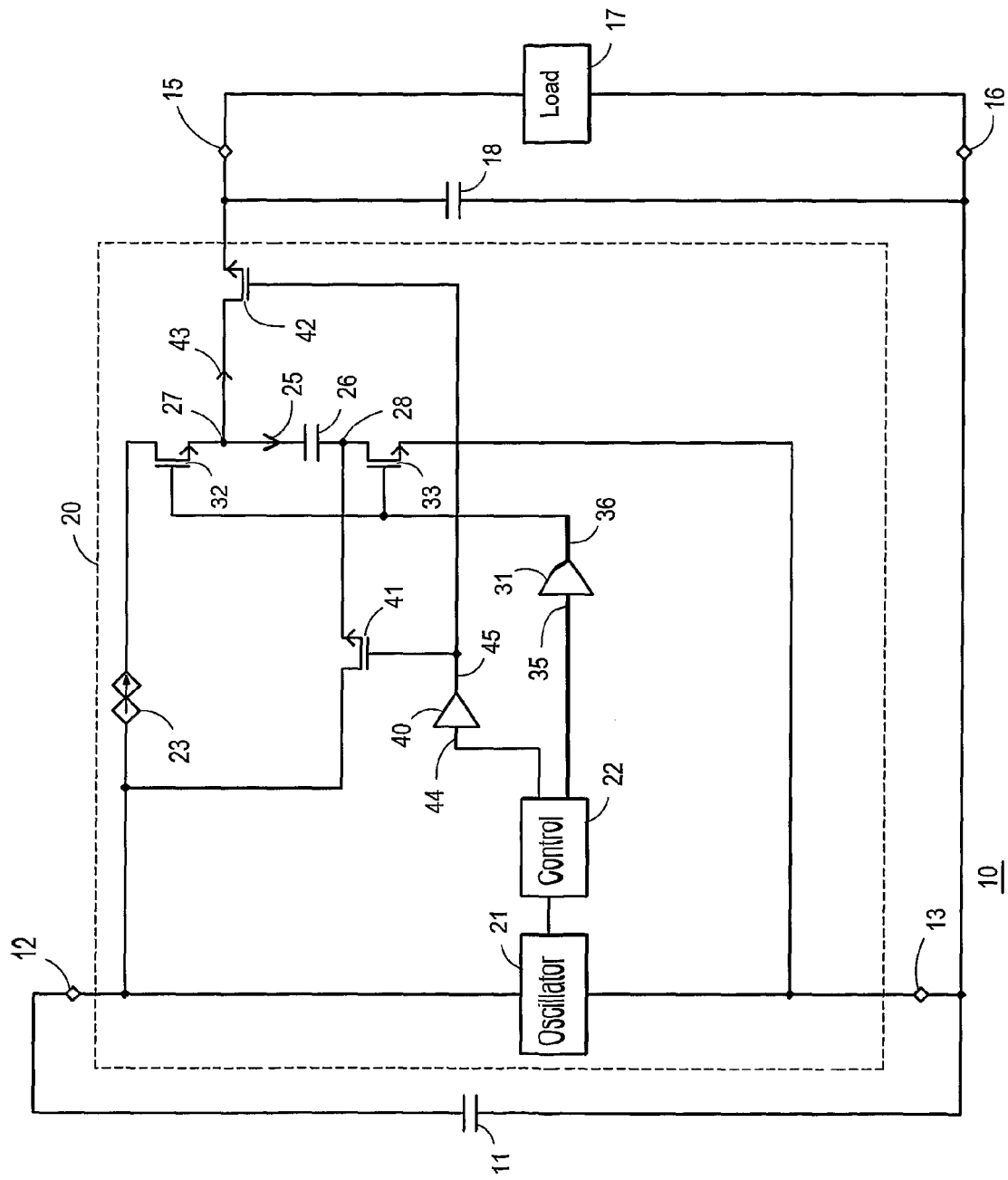
FIG. 1 schematically illustrates an embodiment of a portion of a dc/dc power supply system having a switched capacitor controller in accordance with the present invention.

FIG. 1 schematically illustrates an embodiment of a portion of a dc/dc power supply system 10 that includes an exemplary form of a switched capacitor dc/dc voltage regulator or switched capacitor controller 20. The configuration utilized for controller 20 minimizes current spikes and noise generation. System 10 is configured to receive a dc voltage from a dc voltage source, such as a battery 11, and form a regulated dc voltage or output voltage that is utilized by a load 17, for example a cellular phone. Controller 20 is configured to receive the dc voltage between a voltage input 12 and a voltage return 13 and form the output voltage on an output 15 of controller 20. A voltage return 16 of system 10 generally is connected to one terminal of the dc voltage source, such as battery 11, to form a common terminal for system 10. Return 13 generally i connected to return 16. A smoothing capacitor 18 may be connected between output 15 and return 16 to reduce ripple in the output voltage.

The exemplary form of controller 20 generally includes a flying capacitor 26 that is switched in different configurations in order to assist in forming the output voltage on output 15, a current source 23 that assist in charging capacitor 26, charging switches, such as transistors 32 and 33, that are utilized for configuring capacitor 26 to be charged, discharging switches, such as transistors 41 and 42, that are used for configuring capacitor 26 to assist in forming the output voltage, a driver 40 that is configured to selectively enable and disable transistors 41 and 42, and a driver 31 that is configured to selectively enable and disable transistors 32 and 33. An oscillator 21 generally forms a clock signal that is used for controlling the switching of capacitor 26. A control circuit or control 22 receives the clock signal and forms individual control signals for drivers 40 and 31. Control 22 generally forms the control signals with timing that is required to control transistors 32, 33, 41, and 42 to performed the desired switching of capacitor 26 such as forming the drive signals as non-overlapping and out of phase. Oscillators and controls such as oscillator 21 and control 22 are well known to those skilled in the art. A first control signal having a first frequency from a first output of control 22 is received on an input 44 of driver 40 and a second control signal having substantially the first frequency from a second output of control 22 is received on an input 35 of driver 31. An output 36 of driver 31 is connected to the gates of transistors 32 and 33, and an output 45 of driver 40 is connected to the gates of transistors 41 and 42. Those skilled in the art will appreciate that controller 20 is illustrated as an exemplary embodiment of a dc/dc controller and that dc/dc controllers may have a plurality of flying capacitors, such as capacitor 26, and a plurality of associated drivers, such as drivers 31 and 40, and switches, such as transistors 32, 33, 41, and 42. Thus, those skilled in the art will also understand that the exemplary embodiment of controller 20 is simplified for clarity of the description. In some embodiments, capacitor 26 may be external to controller 20, such as an embodiment with controller 20 formed on a semiconductor die, in order to minimize the cost of controller 20.

Figure 2:
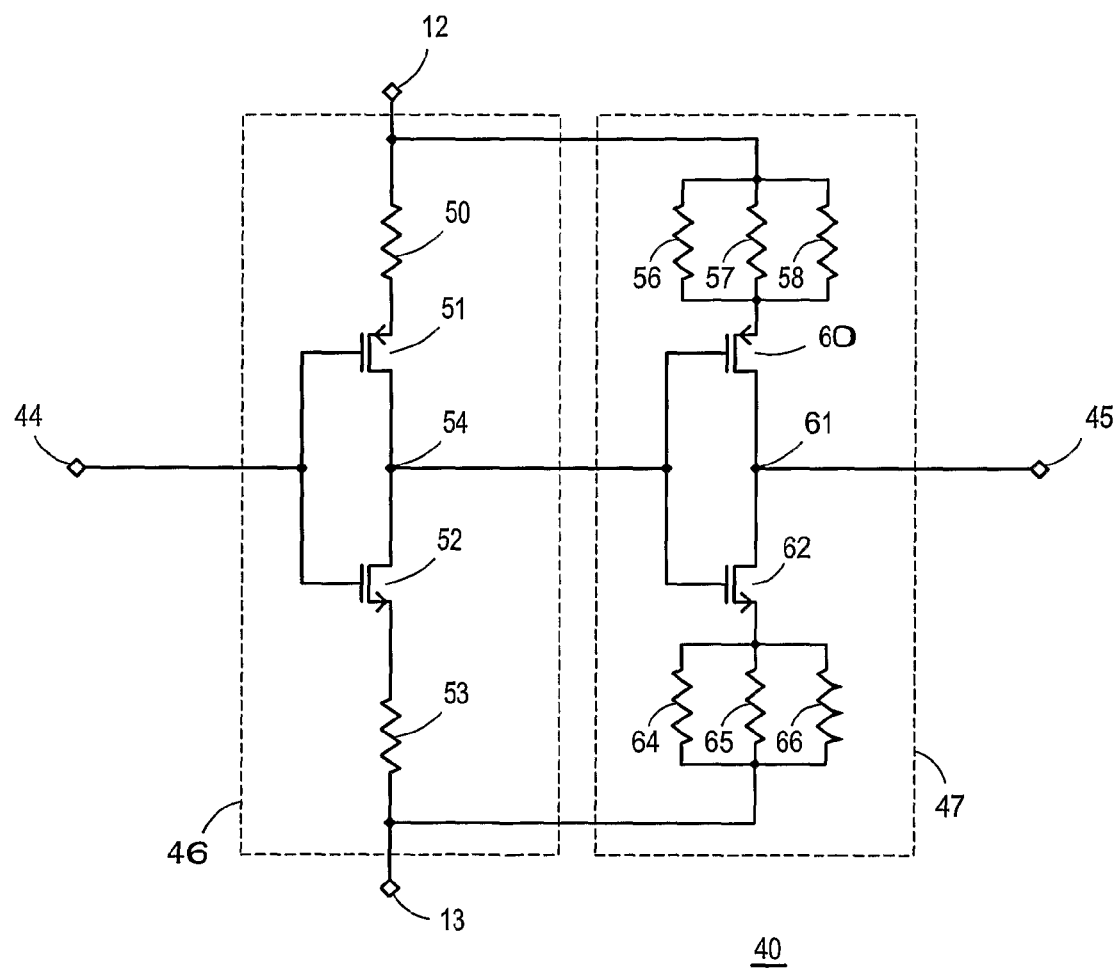
FIG. 2 schematically illustrates an embodiment of a portion of a driver of the switched capacitor controller of FIG. 1 in accordance with the present invention.

FIG. 2 schematically illustrates an embodiment of a portion of driver 40. Driver 40 includes an input stage 46 that receives the control signal from input 44 and an output stage 47 that forms the output drive signal or drive signal on output 45. Input stage 46 includes upper input transistor 51, upper input resistor 50, lower input transistor 52, and lower input resistors 53. Output stage 47 includes upper output transistor 60, upper output resistors 56, 57, and 58, lower output transistor 62, and lower output resistors 64, 65, and 66.

Figure 3:
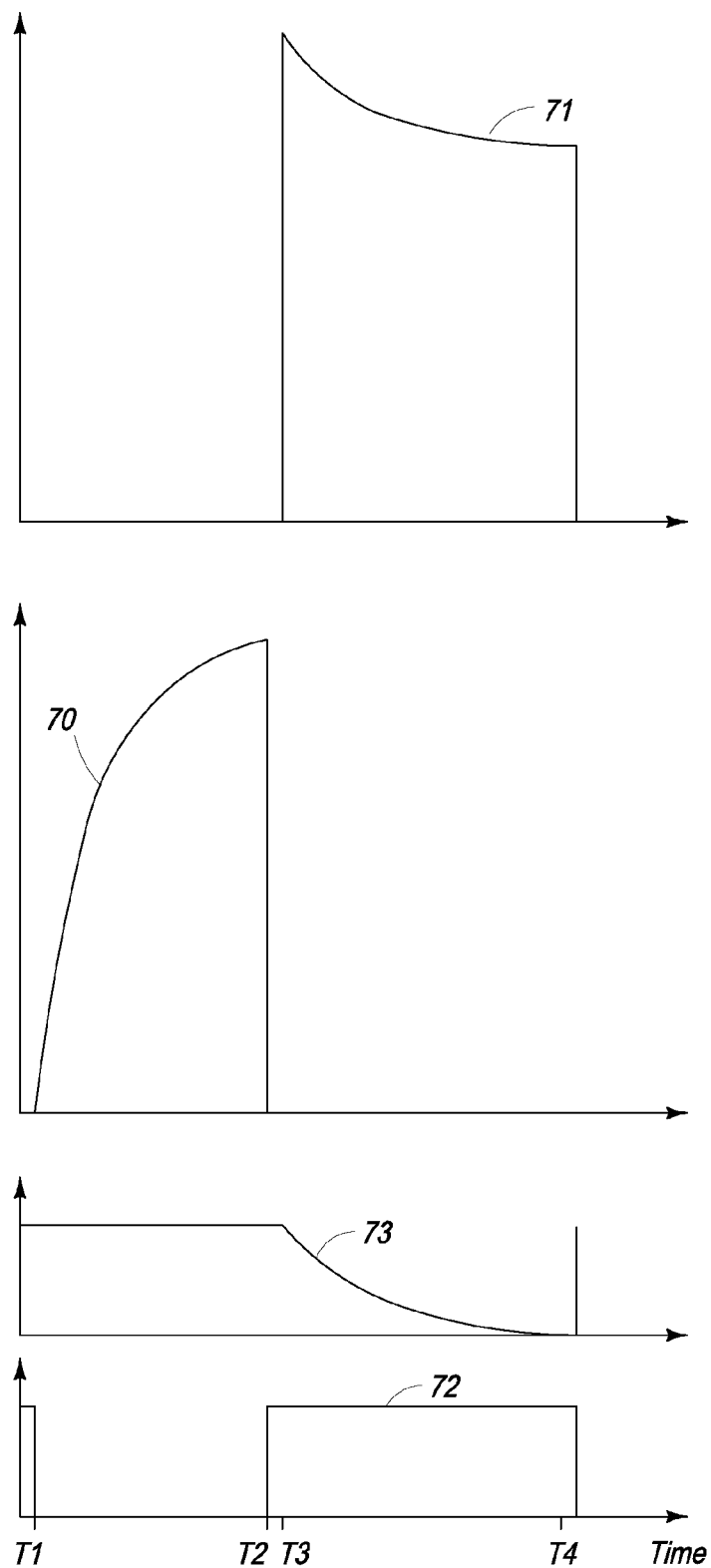
FIG. 3 is a graph having plots illustrating some of the signals during the operation of a portion of the switched capacitor controller of FIG. 1 in accordance with the present invention.

FIG. 3 is a graph having plots illustrating some of the signals during the operation of controller 20. The abscissa indicates time and the ordinate illustrates increasing value of the illustrated signal. A plot 70 illustrates a charging current 25 that flows from battery 11 through source 23 and transistor 32 to charge capacitor 26. A plot 71 illustrates a discharge current 43 supplied by capacitor 26 through transistor 42 to output 15. A plot 72 illustrates the signal on output 36, and a plot 73 illustrates the signal on output 45. This description has references to FIG. 1, FIG. 2, and FIG. 3.

In operation of the exemplary embodiment of controller 20, oscillator 21 and control 22 form the first control signal during a first phase of controller 20 that is utilized to enable transistors 32 and 33 in order to charge capacitor 26. In the preferred embodiment, transistors 32, 33, 41, and 42 are P-channel transistors, thus, a low signal is required to enable the transistors. As illustrated at a time T1, negative going drive signal 36 enables transistors 32 and 33 to couple one terminal of capacitor 26 to source 23 and another terminal to return 13. Since source 23 is coupled to input 12, thus to battery 11, source 23 supplies a controlled current from battery 11 to charge capacitor 26 to a voltage substantially equal to the voltage of battery 11. Those skilled in the art will appreciate that due to losses, capacitor 26 may only charge to within about seventy to eighty percent (70-80%) of the voltage of battery 11. As illustrated by plot 70, current 25 supplied by source 23 charges capacitor 26 at a controlled rate that limits the maximum value of current 25. Consequently, current source 23 assists in reducing the noise caused by enabling transistors 32 and 33 to charge capacitor 26.

Thereafter, oscillator 21 and control 22 form the second control signal during a second pease of controller 20 that is utilized to enable transistors 41 and 42 to couple capacitor 26 in series with battery 11 to form the output voltage on output 15. During this second phase, the second control signal is received by driver 40. As illustrated by plot 73 at a time T3, driver 40 forms the second drive signal on output 45 as an analog signal that has a time dependent transition time. The time dependent transition time slowly enables transistors 41 and 42. Since the second drive signal is a negative going signal, driver 40 forms a time dependent fall time for second drive signal. The time dependent transition time enables transistors 41 and 42 over a period of time to slowly increase the value of discharge current 43 that capacitor 26 can supply to output 15 and load 17. Slowly enabling transistors 41 and 42 over the time period prevents spikes in current 43 thereby minimizing the amount of noise during the operation of controller 20. The time dependent transition time can be formed to have a variety of different waveshapes including an exponential waveshape, a saw-tooth waveshape, or a logarithmic waveshape. The preferred embodiment of driver 40 is configured to form an exponential waveshape. As input 44 receives the negative going control signal from control 22, transistor 51 is enabled to pull a node 54 and the gates of transistors 60 and 62 high through transistor 51 and resistor 50. The gate capacitance of transistors 60 and 62 and the resistance of resistors 50 and 53 form a first RC time constant for stage 46. The first time constant slows the rise time of the signal at node 54, thus, the signal to the gates of transistors 60 and 62. As node 54 is charged through resistor 50, mode 54 eventually becomes high enough to begin enabling transistor 62 and disable transistor 60. The resistance of resistors 56, 57, 58, 64, 65, and 66 and the capacitance of the gate of transistors 41 and 42 form a second RC time constant for stage 47. As transistor 62 is being enabled by stage 47, the second time constant further limits the fall time of the second drive signal. The longer fall time rounds the edges of the second drive signal and forms a waveform having a substantially exponential waveshape. The reduced fall time causes transistors 41 and 42 to turn on slowly and transition through the linear operating region of transistors 41 and 42. Going through the linear operating region controls the value of current 43 to slowly increase as transistor 42 is slowly enabled. The value of current 43 reaches its maximum value as transistor 42 becomes fully enabled. Consequently, the waveform of the drive signal applied to the gate of transistors 41 and 42 has a critically damped waveshape or waveform. Generally, the time constant that is formed by drives 40, including output stage 47 combined with the gate capacitance of transistors 41 and 42, is generally in the range from about three percent (3%) to no greater than about twenty-five to seventy-five percent (25%-75%) of the frequency of the control signal on input 44, and preferably is about five percent (5%). Thus, the fall time plus the fully enabled on-time of the second drive signal forms substantially one-half of the total period of the control signal on input 44 as illustrated by plot 73. The time constant of driver 40 generally is formed primarily by the second time constant of stage 47, plus the input capacitance of transistors 41 and 42. The first time constant of stage 46 generally is less than the second time constant of stage 46. The second time constant generally is chosen to be close to the desired time constant for driver 40 and the first time constant is adjusted to form the desired time constant for driver 40. Thus, the first and second time constants form the time dependent transition time and the critically damped waveform. In one embodiment, the second time constant is about three times the first time constant.

Because the preferred embodiment of transistors 41 and 42 is a P-channel transistor, it is important that resistors 64, 65, and 66 are in series with transistor 62 in order to control the fall time for the enabling transistor, transistor 62, that enables transistors 41 and 42. Resistors 56, 57, and 58 are optional in this preferred embodiment since it is only important to have the time dependent transition time for enabling transistors 41 and 42 and not for disabling transistors 41 and 42. However, in some embodiments transistors 41 and 42 may be N-channel transistors and it would be important for resistors 56, 57, and 58 to form a similar type of time constant as formed by resistors 64, 65, and 66.

Because current source 23 is used to charge capacitor 26, the rise and fall time of the drive signal formed by driver 31 is not critical. However, those skilled in the art will appreciate that driver 31 may also be formed to have a time dependent transition time similar to driver 40.

Figure 4:
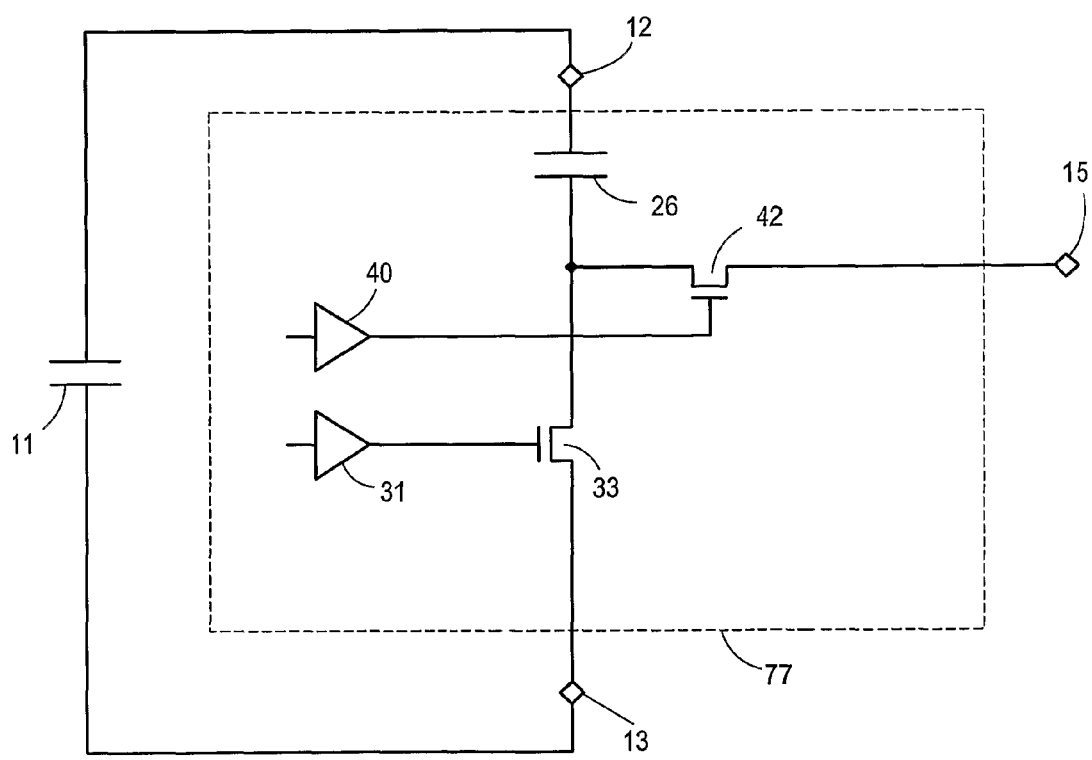
FIG. 4 schematically illustrates an embodiment of a portion of a switched capacitor controller that is an alternate embodiment of the switched capacitor controller of FIG. 1 in accordance with the present invention.

FIG. 4 schematically illustrates an embodiment of a portion of a controller 77 that is an alternate embodiment of controller 20 that was explained in the description of FIG. 1. Controller 77 is configured to form an output voltage on output 15 that has a value that is less than the value of the voltage of battery 11.

Figure 5:
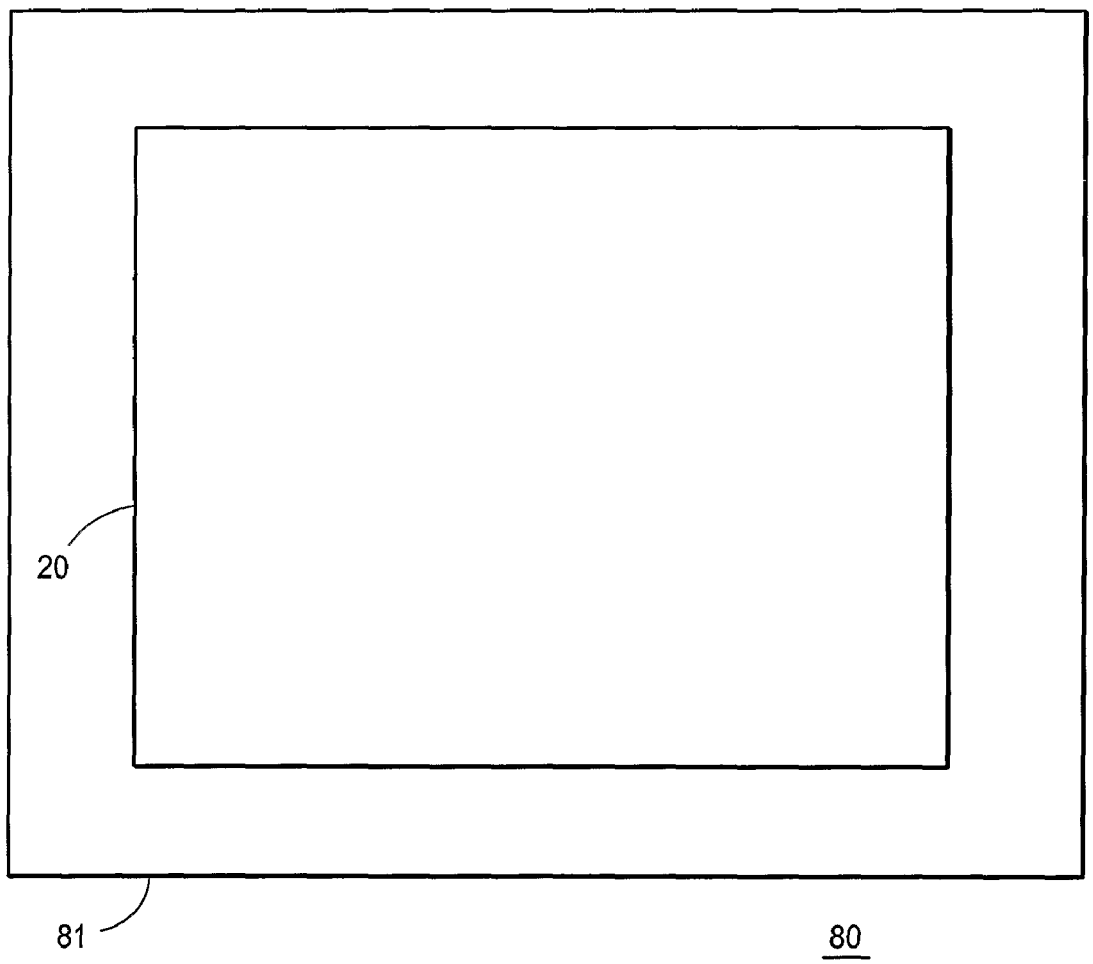
FIG. 5 schematically illustrates an enlarged plan view of a semiconductor device that includes a portion of the switched capacitor controller of FIG. 1 in accordance with the present invention.

FIG. 5 schematically illustrates an enlarged plan view of a portion of an embodiment of a semiconductor device 80 that is formed on a semiconductor die 81. Controller 20 is formed on die 81. Die 81 may also include other circuits that are not shown in FIG. 5 for simplicity of the drawing. Controller 20 and device 80 are formed on die 81 by semiconductor manufacturing techniques that are well known to those skilled in the art.

In view of all of the above, it is evident that a novel device and method is disclosed. Included, among other features, is forming a driver of a dc/dc controller to have a time dependent transition time. The time dependent transition time controls the discharge current from the flying capacitor thereby minimizing noise during the operation of the controller. The time dependent transition time generally is primarily controlled by the value of lower output resistors that are coupled in series with the lower output transistor of the driver. Resistance added to the input stage of the driver also assists in controlling the time dependent transition time.

While the subject matter of the invention is described with specific preferred embodiments, it is evident that many alternatives and variations will be apparent to those skilled in the semiconductor arts. For example, the charge and discharge switches are described as P-channel transistors, but they may be N-channel transistors or other types of switches such as BiCMOS transistors, metal semiconductor FETs (MESFETs), HFETs, Bipolar transistors, BJTs, and other switch structures. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A voltage regulator comprising:
an input configured to receive a voltage from a battery;
a capacitor having first and second terminals and configured to be selectively coupled between the input and a charging node to charge the capacitor and between the input and an output of the voltage regulator to supply current to the output;
a first transistor operably coupled to selectively couple the first terminal of the capacitor to supply the current to the output of the voltage regulator;
a second transistor operably coupled to selectively couple the second terminal of the capacitor to the input to supply the current to the output wherein the first transistor and the second transistor are enabled substantially simultaneously; and
a first driver having an output stage configured to drive a control electrode of at least one of the first transistor or the second transistor with a drive signal having an edge that has a first time dependent transition time having a first time constant that is between about five and seventy-five percent of a frequency of a signal received by the driver and using the edge to enable one of the first transistor or the second transistor to operate in a linear operating mode during the transition time prior to fully enabling the switch after the transition time.

2. The voltage regulator of claim 1 further including a third transistor operably coupled to selectively couple the first terminal of the capacitor to be charged from the voltage from the battery and a fourth transistor operably coupled to selectively couple the second terminal of the capacitor to a common terminal wherein the third and fourth transistors are enabled in phase with each other and out of phase with the first and second transistors.

3. The voltage regulator of claim 1. wherein the output stage of the first driver has a first resistance coupled to an enabling transistor of the first driver.

4. The voltage regulator of claim 1 wherein the output stage of the first driver includes a first resistance coupled in series between an enabling transistor and a voltage node of the first driver wherein a first current carrying electrode of the enabling transistor is coupled to an output of the first driver.

5. The voltage regulator of claim 4 wherein a second current carrying electrode of the enabling transistor is coupled to a terminal of the first resistance.

6. A method of forming a switched capacitor controller comprising:
forming the switched capacitor controller to receive a dc voltage and switch a capacitor to form an output voltage from the dc voltage;
operably coupling a first transistor to couple the capacitor to supply current to an output of the switched capacitor controller;
operably coupling a second transistor of the switched capacitor controller to couple the capacitor to receive the dc voltage wherein the first and second transistors are enabled substantially simultaneously; and
configuring a driver of the switched capacitor controller to form a drive signal that drives a control electrode of at least one of the first transistor or the second transistor wherein the driver forms the drive signal to have an edge with a transition time that has a time constant for enabling the switch that is between approximately three to seventy-five percent of a period of a frequency used to switch the capacitor and wherein the edge of the drive signal operates the switch in a linear operating region of the switch for the transition time prior to fully enabling the switch after the transition time.

7. The method of claim 6 wherein configuring the driver of the switched capacitor controller to form the drive signal includes configuring the driver to have a first resistance to a voltage source.

8. The method of claim 6 wherein configuring the driver of the switched capacitor controller to form the drive signal includes coupling an output of the driver to a the control electrode of one of the first or second transistors wherein the control electrode has a first capacitance and wherein the first resistance and the first capacitance form the time constant.

9. The method of claim 6 wherein configuring the driver of the switched capacitor controller to form the drive signal includes configuring an enabling transistor of the driver in series with a first resistance and coupling an output of the driver to a gate of the first and second transistors.

10. The method of claim 9 wherein configuring the enabling transistor of the driver in series with the first resistance includes configuring an N-channel transistor of the output of the driver in series with a first resistor and coupling an output of the driver to a gate of a P-channel transistor.

11. The method of claim 10 further including configuring a P-channel transistor of the output of the driver in series with a second resistor.

12. The method of claim 6 wherein configuring the driver of the switched capacitor controller to form the drive signal includes configuring an output stage of the driver to have the time constant.

13. The method of claim 6 wherein configuring the driver of the switched capacitor controller to form the drive signal includes configuring the time constant no greater than approximately twenty-five percent of the period of the frequency used to switch the capacitor.

14. The method of claim 6 wherein configuring the driver of the switched capacitor controller to form the drive signal includes configuring the time constant no less than approximately five percent of the period of the frequency used to switch the capacitor.

15. A method of forming a switched capacitor controller comprising:
configuring an output transistor of the switched capacitor controller to couple a capacitor to an output of the switched capacitor controller; and
configuring the switched capacitor controller to drive a control electrode of the output transistor with a drive signal having a time dependent transition time wherein a transition time of the drive signal that is used to begin enabling the switch has a time constant that is between' about three to seventy-five percent of a frequency of a signal received by the driver wherein the switch is operated in a linear operating region during the transition time prior to the drive signal fully enabling the switch.

16. The method of claim 15 wherein configuring the switched capacitor controller to drive the control electrode of the output transistor with the drive signal having the time dependent transition time includes configuring the switched capacitor controller to form the time dependent transition time as a time constant that is less than approximately twenty-five percent of a frequency used to switch the capacitor.

17. The method of claim 15 wherein configuring the switched capacitor controller to drive the control electrode of the output transistor with the drive signal having the time dependent transition time includes configuring the switched capacitor controller to form the time dependent transition time as a time constant that is less than approximately five percent of a frequency used to switch the capacitor.

* * * * *

UNITED STATES PATENT AND TRADEMARK OFFICE
CERTIFICATE OF CORRECTION

PATENT NO. : 7,804,698 B2  
APPLICATION NO. : 11/573592  
DATED : September 28, 2010  
INVENTOR(S) : Remi Gerber Page 1 of 1

It is certified that error appears in the above-identified patent and that said Letters Patent is hereby corrected as shown below:

In the Claims:

In claim 6: column 6, line 18, please change --the switch-- to "the one of the first transistor or the second transistor".

In claim 6: column 6, line 21, please change --the switch-- to "the one of the first transistor or the second transistor".

In claim 6: column 6, line 22, please change --the switch-- to "the one of the first transistor or the second transistor".

In claim 6: column 6, line 23, please change --the switch-- to "the one of the first transistor or the second transistor".

In claim 8: column 6, line 30, please change --a the-- to "the".

Signed and Sealed this  
Twenty-second Day of July, 2014

Michelle K. Lee  
*Deputy Director of the United States Patent and Trademark Office*